(12) United States Patent
Kim et al.

(10) Patent No.: US 11,631,700 B2
(45) Date of Patent: Apr. 18, 2023

(54) FLEXIBLE DISPLAY APPARATUS WITH POROUS SUBSTRATE

(71) Applicant: LG Display Co., Ltd., Seoul (KR)

(72) Inventors: MinSeok Kim, Paju-si (KR); SeYeoul Kwon, Paju-si (KR); YounYeol Yu, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/228,213

(22) Filed: Dec. 20, 2018

(65) Prior Publication Data
US 2019/0206903 A1  Jul. 4, 2019

(30) Foreign Application Priority Data
Dec. 29, 2017  (KR) .................. 10-2017-0184046

(51) Int. Cl.
*H01L 27/12* (2006.01)
*H01L 51/00* (2006.01)
*H01L 27/32* (2006.01)
*H01L 51/52* (2006.01)

(52) U.S. Cl.
CPC ...... *H01L 27/1218* (2013.01); *H01L 27/1262* (2013.01); *H01L 27/3244* (2013.01); *H01L 51/0097* (2013.01); *H01L 51/5268* (2013.01); *H01L 51/5275* (2013.01)

(58) Field of Classification Search
CPC ............. H01L 51/0097; H01L 27/1218; H01L 27/1262; H01L 27/3244
USPC ......................................................... 257/72
See application file for complete search history.

(56) References Cited

U.S. PATENT DOCUMENTS

| | | | |
|---|---|---|---|
| 2006/0054594 A1* | 3/2006 | Lifka | H01L 21/31111 216/41 |
| 2006/0273304 A1* | 12/2006 | Cok | H01L 51/524 257/40 |
| 2008/0055831 A1* | 3/2008 | Satoh | H05K 1/0281 361/600 |
| 2010/0200286 A1* | 8/2010 | Melcher | G02F 1/155 174/261 |
| 2013/0057456 A1 | 3/2013 | Omoto | |
| 2015/0188080 A1 | 7/2015 | Choi et al. | |
| 2015/0200333 A1 | 7/2015 | Okumoto et al. | |
| 2016/0064464 A1* | 3/2016 | Namkung | H01L 27/1225 257/40 |
| 2016/0066408 A1* | 3/2016 | Afentakis | G02F 1/133305 257/72 |
| 2016/0085352 A1* | 3/2016 | Kang | G06F 3/0412 345/174 |
| 2016/0150641 A1 | 5/2016 | Yoo | |

(Continued)

FOREIGN PATENT DOCUMENTS

| | | |
|---|---|---|
| EP | 1830336 A1 | 9/2007 |
| JP | 2009-259929 A | 11/2009 |

(Continued)

*Primary Examiner* — Hoai V Pham
(74) *Attorney, Agent, or Firm* — Seed IP Law Group LLP

(57) ABSTRACT

A display apparatus is disclosed, which may endure deformation by an external force. The display apparatus includes a flexible substrate (110) including a plurality of pores (115); and a pixel array layer (PL) provided on a first surface of the flexible substrate (110), wherein the plurality of pores are (115) provided to be concave from a second surface opposite to the first surface of the flexible substrate (110).

20 Claims, 4 Drawing Sheets

(56) References Cited

U.S. PATENT DOCUMENTS

| | | | |
|---|---|---|---|
| 2017/0294610 A1 | 10/2017 | Sasaki | |
| 2017/0309843 A1* | 10/2017 | Kim | B32B 3/266 |
| 2018/0090698 A1* | 3/2018 | Jeong | H01L 51/0097 |
| 2018/0114491 A1* | 4/2018 | Tokuda | H01L 27/3258 |
| 2018/0308911 A1* | 10/2018 | Wang | H01L 41/18 |
| 2018/0350892 A1* | 12/2018 | Nishinohara | H01L 27/3276 |

FOREIGN PATENT DOCUMENTS

| | | |
|---|---|---|
| KR | 10-2008-004232 A | 1/2008 |
| KR | 10-2015-0078914 A | 7/2015 |
| KR | 10-2016-0062328 A | 6/2016 |
| KR | 10-2017-0033753 A | 3/2017 |
| WO | 2015/084073 A1 | 6/2015 |

* cited by examiner

FLEXIBLE DISPLAY APPARATUS WITH POROUS SUBSTRATE

CROSS-REFERENCE TO RELATED APPLICATIONS

This application claims the benefit of the Korean Patent Application No. 10-2017-0184046 filed on Dec. 29, 2017, which is hereby incorporated by reference as if fully set forth herein.

BACKGROUND

Technical Field

The present disclosure relates to a display apparatus.

Description of the Related Art

With the advancement of the information age, a demand for a display device for displaying an image has been increased in various forms. Recently, a display device of a slimmer size has been launched. Particularly, a flexible display device has many advantages in that it is easy to carry it and may be applied to various shaped devices.

Since a flexible display device may be folded or wound like a paper, the flexible display device has been consistently studied as a next generation display device owing to advantages of portability and storage. For example, examples of the flexible display devices include liquid crystal display devices, light emitting display devices, electrophoretic display devices, micro light emitting diode display devices, electro-wetting display devices, or quantum dot light emitting display devices, or the like.

Therefore, the flexible display device may need deformation of a substrate and a line type to easily endure an external force.

The background art described as above is technical information owned by the inventors of the present disclosure to devise the present disclosure or obtained during the step of devising the present disclosure, and may not necessarily be regarded as the known art disclosed to the public before filing of the present disclosure.

BRIEF SUMMARY

The present disclosure has been made in view of the above problems, and it is an object of the present disclosure to provide a display apparatus that may endure deformation by an external force.

In accordance with an aspect of the present disclosure, the above and other objects can be accomplished by the provision of a display apparatus and a method of manufacturing a display apparatus according to the independent claims. Further embodiments are described in the dependent claims. According to an aspect of the present disclosure, a display apparatus comprises: a flexible substrate including a plurality of pores; and a pixel array layer provided on a first surface of the flexible substrate, wherein the plurality of pores are provided to be concave from a second surface opposite to the first surface of the flexible substrate. The flexible substrate may include: a first portion from a center plane of the flexible substrate to the first surface; and a second portion from the center plane of the flexible substrate to the second surface, and the plurality of pores are provided in the second portion. The plurality of pores may be formed in parallel at the same size to have constant intervals. The plurality of pores may have a circular shape. The pixel array layer may include: a thin film transistor layer; and routing lines for connecting a plurality of electrodes provided in the thin film transistor layer. The routing lines may be formed in a line structure with elasticity. The routing lines may be formed to cross each other to have a diamond shape. In this case, the routing lines may include: a plurality of first lines having a shape extended in a straight line along a first direction; and a plurality of second lines having a shape extended in a straight line along a second direction vertically crossing the first direction. Alternatively, the routing lines may be formed to have a wave shape. In this case, the routing lines may include a plurality of third lines arranged in parallel and extended in a curved line along a third direction. Also, the routing lines may further include a plurality of fourth lines arranged in parallel and extended in a curved line along a fourth line direction. The plurality of third lines may be formed to be spaced apart from each other at a constant interval along the fourth direction. The plurality of fourth lines may be formed to be spaced apart from each other at a constant interval along the third direction. The fourth direction may be perpendicular to the third direction. According to another aspect of the present disclosure, a method of manufacturing a display apparatus comprises: forming a sacrificial layer on a carrier substrate, the sacrificial layer including a plurality of circular patterns at a side facing away from the carrier substrate; forming a flexible substrate on the sacrificial layer covering the plurality of circular patterns; forming a pixel array layer on the flexible substrate; separating the carrier substrate from the flexible substrate; and removing the sacrificial layer, including the plurality of circular patterns, from the flexible substrate so as to form a plurality of pores in the flexible substrate.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION DISCLOSURE

Figure 1:
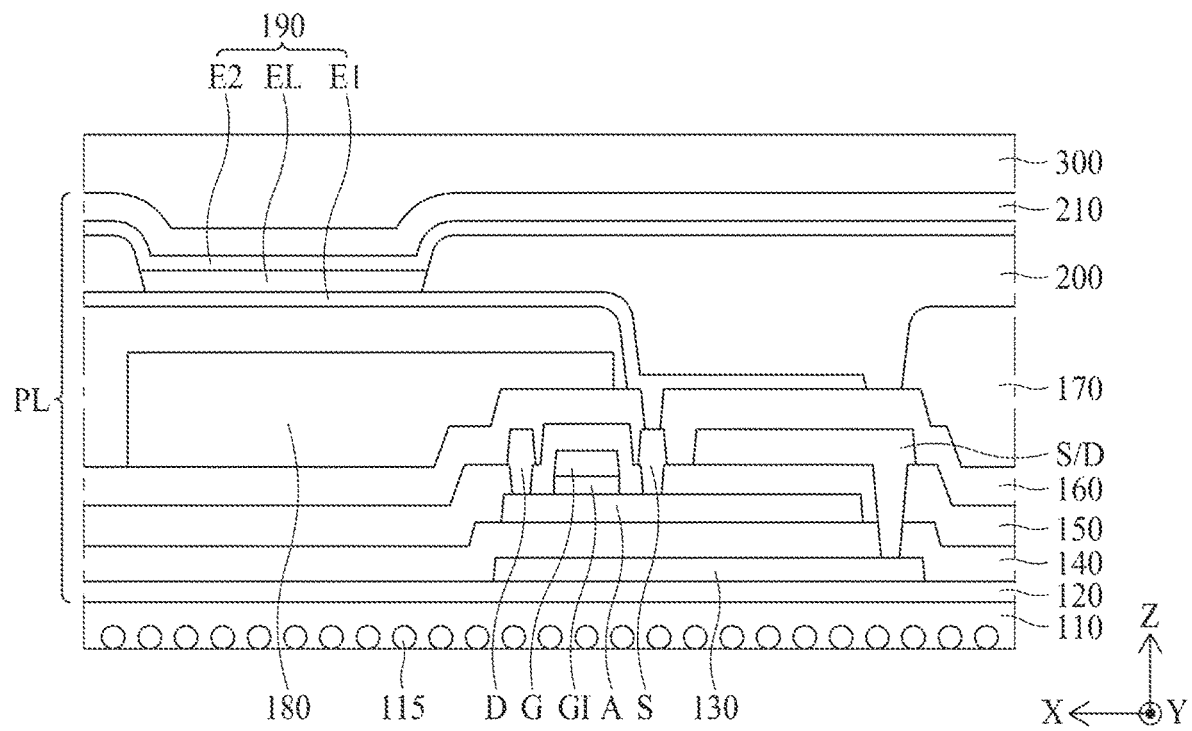
FIG. 1 is a cross-sectional view illustrating a display apparatus according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a reference number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

"A first horizontal-axis direction", "a second horizontal-axis direction" and "a vertical-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the preferred embodiments of the present disclosure will be described in detail with reference to the accompanying drawings. Wherever possible, the same reference numbers will be used throughout the drawings to refer to the same or like parts.

Figure 2:
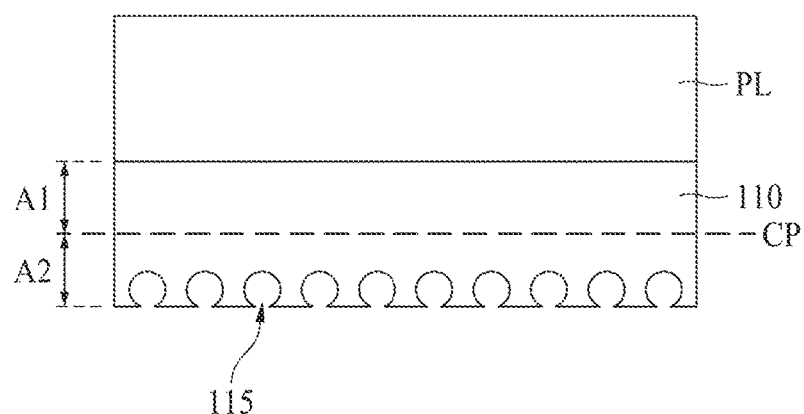
FIG. 2 is a cross-sectional view illustrating an enlarged substrate of FIG. 1.

FIG. 1 is a cross-sectional view illustrating a display apparatus according to an embodiment of the present disclosure. FIG. 2 is a cross-sectional view illustrating an enlarged substrate of FIG. 1.

Referring to FIGS. 1 and 2, the display apparatus according to one embodiment of the present disclosure comprises a flexible substrate 110, and a pixel array layer PL.

The flexible substrate 110 is a base substrate. The flexible substrate 110 may include a transparent polyimide material. The flexible substrate 110 made of a polyimide material may be a hardened polyimide resin coated with a constant thickness on a front surface of a sacrificial layer provided on a carrier glass substrate. The carrier glass substrate may be separated from the flexible substrate 110 by release of the sacrificial layer using a laser release process.

The flexible substrate 110 according to one embodiment includes a first area A1 and a second area A2. The first area A1 is an area from a center portion CP to a first surface of the flexible substrate 110, wherein the first surface may be regarded as a surface which is in contact with the pixel array layer PL which will be described later. The second area A2 is an area from the center portion CP to a second surface of the flexible substrate 110, wherein the second surface may be regarded as a surface which is spaced from the first surface. Namely, the second surface corresponds to the bottom surface of the flexible substrate 110 in the second area A2 and the first surface corresponds to the top surface of the flexible substrate 110 in the first area A1. Since the center portion CP is a reference plane for dividing the first area A1 from the second area A2, and corresponds to a plane where a thickness of the flexible substrate 110 becomes a half, the first area A1 and second area A2 may have the same surface area and thickness. The center portion may also be referred to as a center plane CP herein. The first area A1 may also be referred to as a first portion A1 herein. The second area A2 may also be referred to as a second portion A2 herein.

The flexible substrate 110 according to one embodiment includes a plurality of pores 115.

The plurality of pores 115 are provided in parallel in the flexible substrate 110. For example, the plurality of pores 115 may be provided in parallel to have a certain interval in the second area A2 of the flexible substrate 110 and may be provided concavely from the second surface. The plurality of pores 115 may have a circular shape, for example, sphere or semi-sphere shape, without limitation to the shown shape, and may all have the same size.

The plurality of pores 115 according to one embodiment may be formed when a sacrificial layer having a circular pattern is separated by a laser release process. For example, as the flexible substrate 110 is formed on the sacrificial layer having a circuit pattern and the sacrificial layer is removed by a laser release process, voids, that is a plurality of pores 115 may be formed in the flexible substrate 110. In this case, since the circular pattern provided in the sacrificial layer is formed to have a constant interval and the same size, the plurality of pores 115 formed by the circular pattern may be arranged to have the same size and a constant interval.

Since the plurality of pores 115 according to one embodiment are disposed in parallel at a constant interval while having the same size, when an external force acts on the flexible substrate 110, it is easy to absorb or dissipate the external force. That is, the force may be dissipated by uniformly distributed over the whole surface of the plurality of pores 115 that are arranged regularly. Also, since the plurality of pores 115 are provided in the second area A2 spaced apart from the first surface of the flexible substrate 110, a defect such as a crack may not be caused in the pixel array layer PL provided on the first surface of the flexible substrate 110. For example, if the plurality of pores 115 are provided in the first area A1, since it may be difficult to provide a planarization surface on the first surface of the flexible substrate 110, a defect such as a crack may be caused in the pixel array layer PL provided on the first surface of the flexible substrate 110. However, in the display apparatus according to the present disclosure, since the plurality of pores 115 may be formed in the second area A2 only, there is no problem that the planarization surface is not provided on the flexible substrate 110. Therefore, a defect may be prevented from being generated in the pixel array layer PL.

In the display apparatus according to the present disclosure, a temperature difference may be generated inside of the flexible substrate by the plurality of pores 115. For example, since the area where the plurality of pores 115 are formed in the flexible substrate 110 has a low temperature and an area where the plurality of pores 115 are not formed in the flexible substrate 110 has a high temperature, a temperature difference may be generated inside of the flexible substrate 110. In addition, since the area where the plurality of pores 115 are not formed in the flexible substrate 110 absorbs heat during a release process, the area may have a relatively high temperature.

In the display apparatus according to the present disclosure, since a temperature difference is generated in the flexible substrate by the plurality of pores 115, a strain (or, elongation) of the flexible substrate 110 may be increased. Since the area where the plurality of pores 115 are not formed in the flexible substrate 110 absorbs heat, the area may have rigidity. For example, the flexible substrate 110 may be formed of a polyimide material, which may have rigidity while absorbing heat. However, since the display apparatus according to the present disclosure includes the plurality of pores in the flexible substrate 110, it is more likely to dissipate the heat energy than a display apparatus which does not include a plurality of pores 115. Therefore, in the display apparatus according to the present disclosure, the rigidity of the flexible substrate 110 may be reduced or weakened, whereby the strain of the flexible substrate 110 may be increased.

The plurality of pores 115 according to an embodiment may be provided on an entire surface of the flexible substrate 110. For example, the plurality of pores 115 may be provided to be extended to a non-active area and not only provided on the active area of the flexible substrate 110. In this way, since the plurality of pores 115 are provided on the entire surface of the flexible substrate 110, the rigidity at an edge portion of the flexible substrate 110 may be reduced, whereby elasticity of the edge portion of the flexible substrate 110 may be maintained.

The display apparatus according to the present disclosure may be applied to a stretchable display apparatus. At this time, since the display apparatus according to the present disclosure includes the flexible substrate 110 having high elasticity due to the control of the strain, it is easy to apply the display apparatus according to the present disclosure to the stretchable display apparatus.

The pixel array layer PL is provided on the first surface of the flexible substrate 110. The pixel array layer PL according to one embodiment includes a first buffer layer 120, a light-shielding layer 130, a second buffer layer 140, a thin film transistor layer, a planarization layer 170, a color filter layer 180, a light emitting diode layer 190, a bank 200, and an encapsulation layer 210.

The first buffer layer 120 is provided on the first surface of the flexible substrate 110. The first buffer layer 120 is formed on an entire surface of the first surface of the flexible substrate 110 to prevent water or moisture from being permeated into the pixel array layer PL through the flexible substrate 110. The first buffer layer 120 according to an embodiment may be made of a plurality of inorganic films which are deposited alternately. For example, the first buffer layer 120 may be formed of a multi-layered film of one or more inorganic films of a silicon oxide film (SiOx), a silicon nitride film (SiNx) and SiON, which are deposited alternately.

The light-shielding layer 130 is provided between the flexible substrate 110 and the thin film transistor. For example, the light-shielding layer 130 may be provided between the first buffer layer 120 and an active layer A of semiconductor material included in the thin film transistor layer. The light-shielding layer 130 may be made of a conductive material, and may be used as a line. The light-shielding layer 130 serves to mainly shield external light.

The second buffer layer 140 is provided on the light-shielding layer 130. The second buffer layer 140 is formed to prevent water from being permeated into the pixel array layer PL through the flexible substrate 110 in the same manner as the first buffer layer 120. The second buffer layer 140 according to one embodiment may be made of a plurality of inorganic films which are deposited alternately. For example, the second buffer layer 140 may be formed of a multi-layered film of one or more inorganic films of a silicon oxide film (SiOx), a silicon nitride film (SiNx) and SiON, which are deposited alternately.

The thin film transistor layer may include scan lines, data lines, driving power lines, and a pixel driving circuit.

The scan lines may be arranged in parallel with a first length direction X of the flexible substrate 110 and spaced apart from each other along a second length direction Y of the flexible substrate 110.

The data lines may be arranged in parallel with the second length direction Y of the flexible substrate 110 and spaced apart from each other along the first length direction X of the flexible substrate 110.

The power driving lines are arranged in parallel with the data lines.

The pixel driving circuit is provided in a pixel area defined by crossing between the scan lines and the data lines, and may include at least two thin film transistors and at least one capacitor. This pixel driving circuit allows the light emitting diode layer to emit light in accordance with a scan signal supplied from the scan lines adjacent to each other, a driving power supplied from the driving power lines adjacent to each other, and a data signal supplied from the data lines.

The thin film transistor includes a semiconductor layer A, a gate electrode G, and source/drain electrodes S/D.

The semiconductor layer A is provided on the second buffer layer 140. The semiconductor layer A may be comprised of a semiconductor material, but not limited to, made of any one of an amorphous silicon, a polycrystalline silicon, an oxide and an organic material.

The gate electrode G is formed on the gate insulating layer GI together with the scan lines. The gate electrode G is covered by a first inter-layer dielectric layer 150.

The source/drain electrodes S/D are formed on one side or the other side of the first inter-layer dielectric layer 150 to overlap one side or the other side of the semiconductor layer A. The source/drain electrodes S/D are formed together with the data lines and the driving power lines.

The source/drain electrodes S/D may be covered by a second inter-layer dielectric layer 160.

The planarization layer 170 is provided to cover the thin film transistor layer. The planarization layer 170 provides a planarization surface on the thin film transistor while protecting the thin film transistor. The planarization layer 170 according to one embodiment may be made of an organic insulating material such as photo acryl and benzocyclobutene. Preferably, the planarization layer 170 is made of a photo acryl material for convenience of a process.

The color filter layer 180 is provided on the second inter-layer dielectric layer 160. The color filter layer 180 includes a plurality of color filters, which may be referred to as RGB color filters. The color filters are the resin films that include dyes or pigments of blue, green or red, and that filter the white light to a light having any one of the three colors. For example, the blue color filter transmits blue light only, and shields green light and red light.

The light emitting diode layer 190 is provided on the planarization layer 170. The light emitting diode layer 190 according to one embodiment includes a first electrode E1, a light emitting layer EL and a second electrode E2.

The first electrode E1 is an anode electrode, and is provided on the planarization layer 170. The first electrode E1 according to one embodiment receives a data current output from the thin film transistor by being electrically connected with the source electrode S of the thin film transistor through a contact hole provided in the planarization layer 170. The first electrode E1 may be made of a metal material having high reflectivity, and for example, may include, but is not limited to, a material such as Au, Ag, Al, Mo, Mg, or their alloy.

The light emitting layer EL is provided on the first electrode E1 of an opening area defined by the bank 200. The light emitting layer EL may include a hole injecting layer, a hole transporting layer, an organic light emitting layer, an electron transporting layer, and an electron injecting layer, which are sequentially deposited on the first electrode E1. In this case, one or two or more of the hole injecting layer, the hole transporting layer, the electron transporting layer and the electron injecting layer may be omitted. Also, the light emitting layer EL may further include at least one function layer for controlling electrons and/or holes injected into the organic light emitting layer.

The second electrode E2 is provided to cover the light emitting layer EL and the bank 200, and is commonly connected with the light emitting layer EL. The second electrode E2 may be defined as a cathode electrode or a common electrode in accordance with a direction of a current flowing to the light emitting layer EL. The second electrode E2 receives a cathode power source supplied from a driver. In this case, the cathode power source may be a ground voltage or a direct current voltage having a predetermined level.

The second electrode E2 according to one embodiment may be made of a transparent metal material having high light transmittance. For example, the second electrode E2 may include ITO (indium tin oxide), IZO (indium zinc oxide), IZTO (indium zinc tin oxide), ICO (indium cesium oxide) or IWO (indium tungsten oxide), which is a transparent conductive material such as TCO (transparent conductive oxide). Selectively, in this embodiment, to minimize damage of the light emitting layer EL due to a process temperature when the second electrode E2 is formed, the second electrode E2 may be formed of an amorphous transparent conductive material by a low temperature metal deposition process having a process temperature less than 100° C. That is, when the second electrode E2 is formed of a crystalline transparent conductive material, a problem occurs in that the light emitting layer EL is damaged by a high temperature heat treatment process performed for the second electrode E2 to obtain a low resistance value. Therefore, it is preferable that the second electrode E2 is formed of an amorphous transparent conductive material by a low pressure metal deposition process.

The bank 200 is provided on the planarization layer 170 to cover an edge portion of the first electrode E1 and the thin film transistor, thereby defining an opening area. The bank 200 may include an organic insulating material such as benzocyclobutadiene, acryl and polyimide or the like. Additionally, the bank 200 may be formed of a photoresist that includes a black pigment, and in this case, the bank 200 serves as a light-shielding member (or a black matrix).

The encapsulation layer 210 is provided on the light emitting diode layer 190 to protect the light emitting layer EL vulnerable to external water or oxygen, by preventing water or oxygen from being permeated into the light emitting layer EL. That is, the encapsulation layer 210 is provided to cover the second electrode E2. The encapsulation layer 210 may be formed of an inorganic layer or organic layer, or may be formed of a multi-layered structure in which the inorganic layer and the organic layer are deposited alternately.

Additionally, the display apparatus according to the present disclosure may include an encapsulation substrate 300. The encapsulation substrate 300 is arranged on the encapsulation layer 210, and may be a metal foil, a metal sheet, or a metal plate. For example, the encapsulation substrate 300 may be made of an alloy material of Fe and Ni, which has a low thermal expansion coefficient.

According to the encapsulation substrate 300 according to one embodiment is attached to the encapsulation layer 210 by an adhesive layer. The adhesive layer may be a thermal hardening adhesive or a natural hardening adhesive. For example, the adhesive layer may be made of a material such as a pressure sensitive adhesive or a barrier pressure sensitive adhesive having a moisture absorption function.

Additionally, the display apparatus according to the present disclosure may further include a light transmittance film (not shown) attached to the flexible substrate 110.

The light transmittance film is attached to the second surface of the flexible substrate 110 by a transparent adhesive layer. The light transmittance film according to one embodiment may be made of a flexible film, for example, at least one of a polyethylene terephthalate film, an anti-reflection film, a polarizing film and a transmittance controllable film. The light transmittance film may be attached to the second surface of the flexible substrate 110 separated from the carrier glass substrate by the transparent adhesive layer. The transparent adhesive layer may be an optically clear resin (OCR) or an optically clear adhesive (OCA).

Figure 3:
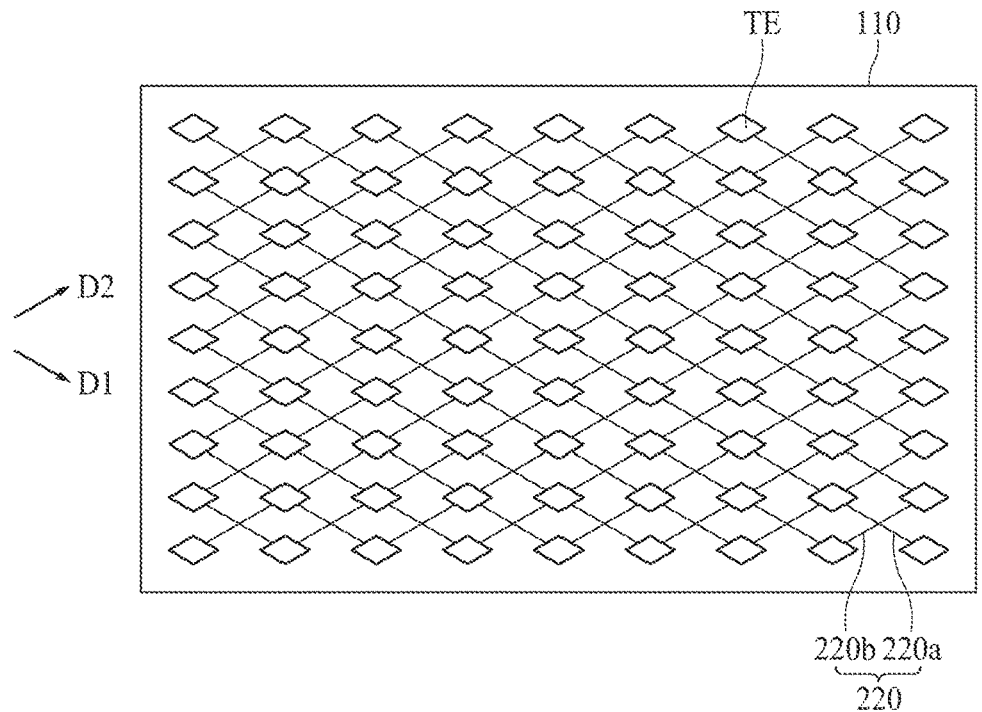
FIG. 3 is a plane view illustrating routing lines formed on a substrate in a display apparatus according to the first embodiment of the present disclosure.

FIG. 3 is a plane view illustrating routing lines formed on a substrate in a display apparatus according to the first embodiment of the present disclosure. In this case, although a plurality of electrodes and routing lines are provided on the pixel array layer, a flexible substrate and a plurality of electrodes and routing lines provided on the flexible substrate are only shown for convenience.

Referring to FIG. 3, a plurality of electrodes TE and routing lines 220 are provided on the flexible substrate 110.

The plurality of electrodes TE may be regarded as a plurality of electrodes that include a gate electrode G and source/drain electrodes S/D included in the plurality of thin film transistors described as above.

The routing lines 220 may be provided on the flexible substrate 110, and thus may connect the plurality of electrodes TE. For example, the routing lines 220 may include scan lines, data lines and power driving lines, which are provided in parallel on the flexible substrate 110. The routing lines 220 include a conductive material which may be a metal, for example.

The routing lines 220 according to one embodiment may be formed in a stretchable line structure. For example, the routing lines 220 may be formed to cross each other so as to have a diamond shape. The routing lines 220 include a plurality of first lines 220a and a plurality of second lines 220b.

The plurality of first lines 220a is provided to be extended in a straight line to be parallel with a first line direction D1. For example, the plurality of first lines 220a may be formed to be spaced apart from each other at a constant interval along a second line direction D2 in parallel with the first line direction D1. The plurality of first lines 220a may be regarded as any one of the scan lines and the data lines.

The plurality of second lines 220b is provided to be extended in a straight line to be parallel with the second line direction D2. For example, the plurality of second lines 220b may be formed to be spaced apart from each other at a constant interval along the first line direction D1 in parallel with the second line direction D2. The plurality of second lines 220b may be regarded as any one of the scan lines and the data lines. For example, when the plurality of first lines 220a are the scan lines, the plurality of second lines 220b correspond to the data lines. In the interim, when the plurality of first lines 220a are the data lines, the plurality of second lines 220b correspond to the scan lines.

In this case, the first line direction D1 and the second line direction D2 may be regarded to cross each other in a vertical direction. The first line direction D1 and the second line direction D2 may be regarded to cross the first length direction X and the second length direction Y in a diagonal line of 45°. However, the first line direction D1 and the second line direction D2 are limited to this example, and the first line direction D1 and the second line direction D2 may be formed to cross the first length direction X and the second length direction Y at various angles while crossing each other in a vertical direction.

As described above, the plurality of first lines 220a and the plurality of second lines 220b may be provided to cross each other in a vertical direction, and the plurality of electrodes TE may be formed at some of points where the plurality of first lines 220a cross the plurality of second lines 220b. As shown, as the plurality of first lines 220a is formed to cross the plurality of second lines 220b, the routing lines 220 may have a diamond shaped structure.

The routing lines 220 according to one embodiment may be formed to have a diamond shape and thus may have high elasticity. For example, if the display apparatus is pulled in the first line direction D1, the plurality of first lines 220a are strained and the plurality of second lines 220b are contracted, whereby all the routing lines 220 are strained in the first line direction D1. When the display apparatus is pulled in the second line direction D2, the plurality of second lines 220b are strained and the plurality of first lines 220a are contracted, whereby all the routing lines 220 are strained in the second line direction D2. Therefore, when a force is applied in a diagonal direction, a stress is minimized, whereby damage caused by an external force may be avoided. The display apparatus according to the present disclosure may be a flexible display apparatus, and has good elasticity when a force is applied from outside, particularly in a diagonal direction, whereby it is advantageous in that a buffering action is better than that of the existing stripe structure. Therefore, the display apparatus according to the present disclosure may be used as a stretchable display apparatus having good elasticity. At this time, even though a corner portion which is an outside of the stretchable display apparatus is strained, a problem such as occurrence of a crack in the routing lines 220 does not occur.

Figure 4:
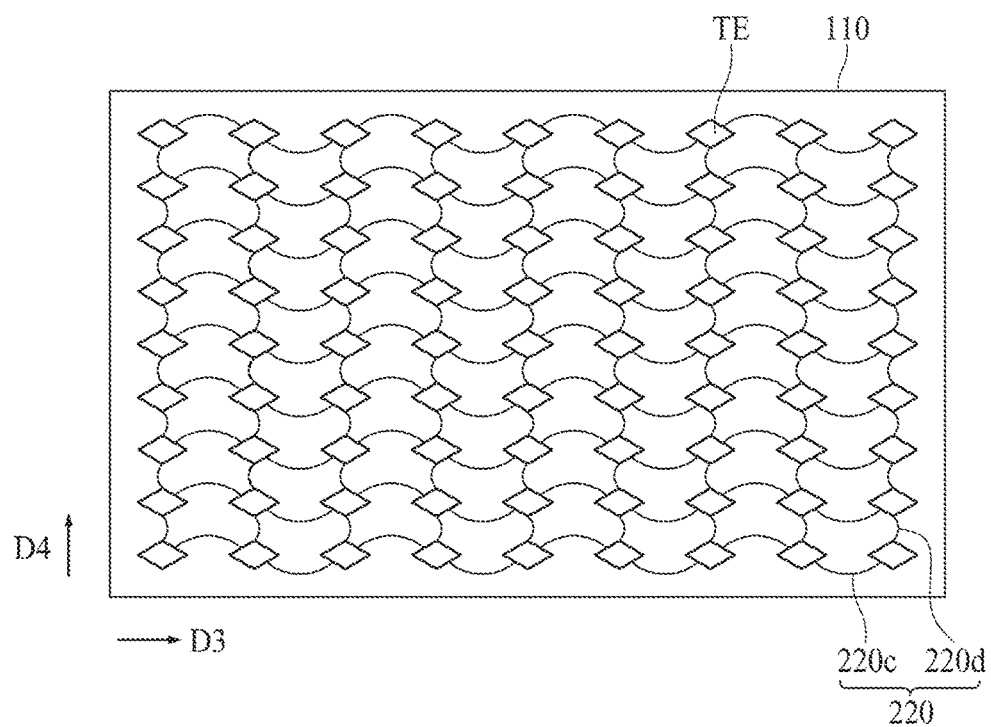
FIG. 4 is a plane view illustrating routing lines formed on a substrate in a display apparatus according to the second embodiment of the present disclosure.

FIG. 4 is a plane view illustrating routing lines formed on a substrate in a display apparatus according to the second embodiment of the present disclosure. In this case, although a plurality of electrodes and routing lines are provided on the pixel array layer, a flexible substrate and a plurality of electrodes and routing lines provided on the flexible substrate are only shown for convenience.

Referring to FIG. 4, a plurality of electrodes TE and routing lines 220 are provided on the flexible substrate 110.

The plurality of electrodes TE may be regarded as a plurality of electrodes that include a gate electrode G and source/drain electrodes S/D included in the plurality of thin film transistors described as above.

The routing lines 220 may be provided on the flexible substrate 110, and thus may connect the plurality of electrodes TE. For example, the routing lines 220 may include scan lines, data lines and power driving lines, which are provided in parallel on the flexible substrate 110. The routing lines 220 include a conductive material which may be a metal, for example.

The routing lines 220 according to one embodiment may be formed in a stretchable line structure. For example, the routing lines 220 may be formed to have a wave shape. The routing lines 220 include a plurality of third lines 220c and a plurality of fourth lines 220d.

The plurality of third lines 220c is provided to be extended in a curved line along a third line direction D3. For example, the plurality of third lines 220c may be formed to be spaced apart from each other at a constant interval along a fourth line direction D4. The third lines 200c are arranged in parallel with the third line direction D3. The plurality of third lines 220c may be regarded as any one of the scan lines and the data lines. The fourth line direction D4 may be perpendicular to the third line direction D3.

The plurality of fourth lines 220d are provided to be extended in a curved line along the fourth line direction D4. For example, the plurality of fourth lines 220d may be formed to be spaced apart from each other at a constant interval along the third line direction D3. The fourth lines 220d are arranged in parallel with the fourth line direction D4. The plurality of fourth lines 220d may be regarded as any one of the scan lines and the data lines. For example, when the plurality of third lines 220c are the scan lines, the plurality of fourth lines 220d correspond to the data lines. In the interim, when the plurality of third lines 220c are the data lines, the plurality of fourth lines 220d correspond to the scan lines.

In this case, the third line direction D3 and the fourth line direction D4 may be regarded to cross each other in a vertical direction. The third line direction D3 may be regarded to be the same as the first length direction X, and the fourth line direction D4 may be regarded to be the same as the second length direction Y.

The routing lines 220 according to one embodiment may be formed to have a wave shape and thus may have high elasticity. For example, since the plurality of third lines 220c have a shape extended in a curved line, a stress applied to each of the plurality of third lines 220c may be distributed by the curved line. Therefore, the routing lines 220 having the plurality of lines 220c may easily be strained or contracted without being damaged when the display apparatus is strained or contracted. Therefore, the display apparatus according to the present disclosure may be used as a stretchable display apparatus having good elasticity. Since the stress applied during rolling or bending is distributed and then minimized, the display apparatus is favorable for use in a rollable display apparatus or a bending display apparatus.

FIGS. 5A to 5D are cross-sectional views illustrating a process of manufacturing a display apparatus according to an embodiment of the present disclosure. FIGS. 5A to 5D briefly illustrate a manufacturing process of a display apparatus. Hereinafter, repeated description of elements repeated with those described as above will be omitted.

Figure 5A:
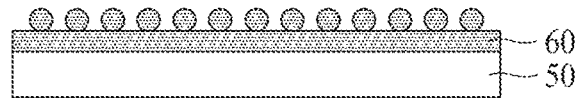
FIGS. 5A to 5D are cross-sectional views illustrating a process of manufacturing a display apparatus according to an embodiment of the present disclosure.

Referring to FIG. 5A, a sacrificial layer 60 is formed on a carrier substrate 50.

The carrier substrate 50 may be formed of a rigid material that may support the flexible substrate 110 to actively perform the process of forming the pixel array layer PL on the flexible substrate 110. For example, the carrier substrate 50 may be a glass substrate, a metal substrate, etc.

The sacrificial layer 60 may be formed of a material deformed by energy having laser beams such that the carrier substrate 50 may be separated from the flexible substrate 110. For example, the sacrificial layer 60 may be formed of Indium Tin Oxide (ITO).

The sacrificial layer 60 according to one embodiment may be formed to have circular patterns. For example, the circular patterns provided on some regions of the sacrificial layer 60 at the same size to have constant intervals may remain through an etching process of an upper surface of the sacrificial layer 60. The process of forming the circular patterns may be regarded as a process of forming a plurality of pores 115 in the flexible substrate 110.

Figure 5B:
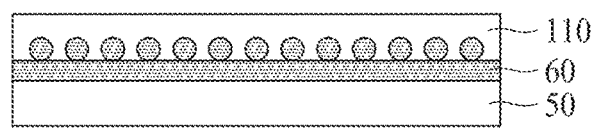

Referring to FIG. 5B, the flexible substrate 110 is formed on the sacrificial layer 60. The flexible substrate 110 may be provided on the sacrificial layer 60 by a coating or deposition process.

Figure 5C:
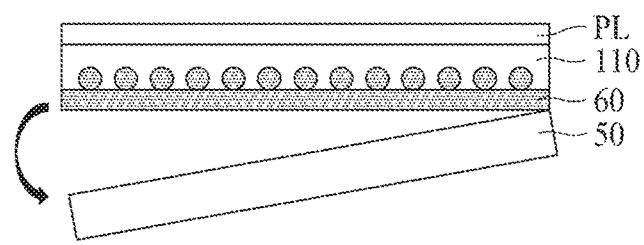

Referring to FIG. 5C, after the pixel array layer PL is formed on the flexible substrate 110, the carrier substrate 50 is separated from the flexible substrate 110 by a laser release process. To this end, laser beams may be irradiated from a lower side of the carrier substrate 50 to the carrier substrate 50. The laser beams irradiated to the carrier substrate 50 may reach the sacrificial layer 60 by transmitting the carrier substrate 50, and the sacrificial layer 60 may be deformed by the laser beams to disconnect a coupling with the carrier substrate 50, whereby the carrier substrate 50 may be separated from the flexible substrate 110.

Figure 5D:
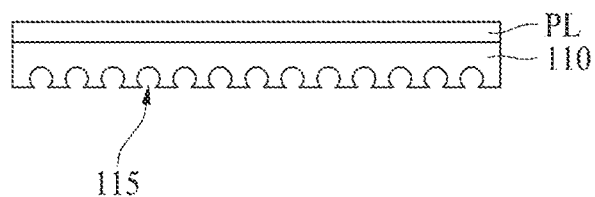

Referring to FIG. 5D, the sacrificial layer 60 is removed by an etching process. At this time, since the circular patterns formed on the sacrificial layer 60 are also removed when the sacrificial layer 60 is removed, the plurality of pores 115 may be formed in the flexible substrate 110. That is, since the space where the circular patterns exist remains as an air layer as the sacrificial layer 60 is removed, the flexible substrate 110 may include the plurality of pores 115.

Figure 6:
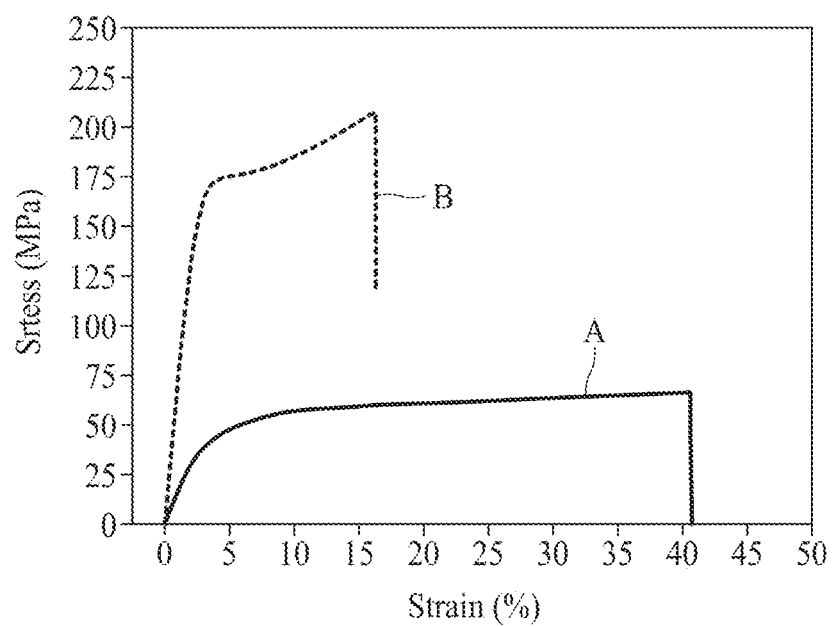
FIG. 6 is a graph illustrating a strain of a display apparatus according to an embodiment of the present disclosure.

FIG. 6 is a graph illustrating a strain of a display apparatus according to one embodiment of the present disclosure. FIG. 6 is a graph for comparing a strain of a display apparatus including a plurality of pores shown in FIGS. 1 and 2, with that of the display apparatus without pores.

Referring to FIG. 6, "A" denotes a strain of the display apparatus according to an embodiment of the present disclosure, and "B" denotes a strain of the display apparatus without pores.

As shown, since "A" is a strain of 40% and "B" is a strain of 15%, it is noted that the strain of the display apparatus according to an embodiment of the present disclosure is increased twice or more because it includes a plurality of pores. Also, since a stress less than 60 MPa is applied to "A" and a stress less than 200 MPa is applied to "B", it is noted that a stress applied to the display apparatus according to an embodiment of the present disclosure is considerably reduced because the display apparatus includes a plurality of pores. However, these numerical values are only exemplary, and are not limited to this case.

As described above, as the display apparatus according to the present disclosure includes the plurality of pores 115 in the flexible substrate 110, the strain may be increased. Also, as the routing lines 220 may be formed to have a shape of high elasticity, the strain may be increased. Therefore, the display apparatus according to the present disclosure may be used as a flexible display apparatus, particularly a stretchable display apparatus. At this time, since the display apparatus has a high strain, the stress applied to the display apparatus may be minimized, flexibility of the display apparatus may be increased, and a crack may be prevented from being generated in the routing lines 220 included in the display apparatus.

As described above, according to the present disclosure, the following effects and advantages may be obtained.

In the display apparatus according to the present disclosure, since the strain is increased and flexibility is increased, a crack may be prevented from being generated.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the scope of the disclosure. Consequently, the scope of the present disclosure is defined by the accompanying claims.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments. Accordingly, the claims are not limited by the disclosure.

What is claimed is:

1. A display apparatus comprising:
a flexible substrate including an active area and a non-active area surrounding the active area, the flexible substrate further including a top most surface, a top portion, a bottom most surface opposite the top most surface, a bottom portion, a center plane, and a plurality of pores, the top most surface spaced from the bottom most surface across a thickness of the flexible substrate, the center plane being centered between the top most surface and the bottom most surface; and
a pixel array layer provided in the active area on the top most surface of the flexible substrate,
wherein the center plane is a reference plane for dividing the top portion from the bottom portion of the flexible substrate, wherein the top portion extends from the center plane to the top most surface, the bottom portion extends from the center plane to the bottom most surface, and the top portion and the bottom portion have a same thickness on opposite sides of the center plane, wherein the bottom portion includes a pore top edge plane that is tangent to a top most edge of each of the plurality of pores, the pore top edge plane being centered in the bottom portion with respect to the center plane and the bottom most surface, wherein the bottom portion includes an upper portion and a lower portion, the upper portion extending from the pore top edge plane to the center plane and the lower portion extending from the pore top edge plane to the bottom most surface, wherein the plurality of pores are disposed in the active area and the non-active area, and provided to be a sphere shape positioned in the lower portion of the bottom portion of the flexible substrate between the bottom most surface and the pore top edge plane of the bottom portion of flexible substrate, the plurality of pores having an area at the bottom most surface that is less than a diameter of the plurality of pores, wherein the plurality of pores are arranged in parallel having a same size and constant intervals between the bottom most surface and the center plane, wherein the plurality of pores is arranged only in the lower portion of the bottom portion, and wherein the pixel array layer includes:
 a thin film transistor layer; and
 routing lines for connecting a plurality of electrodes provided in the thin film transistor layer, and
 wherein the routing lines include:
 a plurality of first lines, each of the first lines having a shape extended in a curved line along a first direction; and
 a plurality of second lines, each of the second lines having a shape extended in a curved line along a second direction crossing the first direction,
 wherein the first line has an arc shape having a substantially constant first curvature entirely from one electrode to a neighboring electrode in the first direction and the second line has an arc shape having a substantially constant second curvature entirely from one electrode to a neighboring electrode in the second direction.

2. The display apparatus according to claim 1, wherein the routing lines are formed to have a wave shape.

3. The display apparatus according to claim 1, wherein the plurality of first lines are formed to be spaced apart from each other at a constant interval along the first direction.

4. The display apparatus according to claim 1 wherein the plurality of second lines are formed to be spaced apart from each other at a constant interval along the second direction.

5. The display apparatus according to claim 4, wherein the second direction is perpendicular to the first direction.

6. The display apparatus of claim 1, wherein the constant first curvature of the first line and the constant second curvature of the second line is substantially identical to each other.

7. The display apparatus of claim 1, wherein each pore has a first diameter, the first diameter being equal to a distance between the bottom plane surface and the pore top edge plane.

8. A display apparatus comprising:
 a flexible substrate including an active area and a non-active area surrounding the active area, and further including a top surface, a bottom surface opposite to the top surface, a center plane between the top surface and the bottom surface of the flexible substrate, a top area defined between the top surface and the center plane, and a bottom area defined between the bottom surface and the center plane;
 a plurality of pores adjacent to the bottom surface of the flexible substrate, each of the pores having a substantially full spherical shape, the plurality of pores having an opening at the bottom surface with an area that is less than a diameter of the plurality of pores;
 a buffer layer on an entire surface including the active area and the non-active area of the top surface of the flexible substrate; and
 a pixel array layer in the active area provided on the top surface of the flexible substrate,
 wherein the plurality of pores are disposed in the active area and the non-active area of the flexible substrate,
 wherein the buffer layer directly contacts the top surface of the flexible substrate,
 wherein the bottom area includes a pore top edge plane located midway between the center plane and the bottom surface, the pore top edge plane being a tangent plane to a top most edge of the plurality of pores,
 wherein the bottom area includes an upper section that extends from the pore top edge plane to the center plane and a lower section that extends from the pore top edge plane to the second surface,
 wherein the plurality of pores are arranged only within the lower section of the bottom area.

9. The display apparatus of claim 8, wherein each pore having a substantially full spherical shape has a first diameter, the first diameter being about half of a distance from the second surface to the center plane.

10. The display apparatus of claim 8, wherein each pore having a substantially full spherical shape has a first diameter, a distance between adjacent pores being greater than half of the first diameter and less than the first diameter.

11. The display apparatus of claim 10, wherein the adjacent pores are evenly spaced along the second surface of the flexible substrate and each pore has substantially the same dimensions.

12. The display apparatus of claim 10, wherein the first diameter of each pore is equal to a distance from the pore top edge plane to the second surface.

13. The display apparatus of claim 8, wherein the top area includes a first height defined between the center plane and the top surface,
 wherein the bottom area includes a second height defined between the center plane and the bottom surface,
 wherein the lower section of the bottom area includes a third height defined between the pore top edge plane and the bottom surface,
 wherein each pore has a first diameter, and
 wherein the flexible substrate includes a fourth height defined between the top surface and the bottom surface.

14. The display apparatus of claim 13, wherein the first diameter of each pore is equal to the third height of the lower section.

15. The display apparatus of claim 13, wherein the fourth height of the flexible substrate is equal to a sum of the first height of the top area and the second height of the bottom area.

16. The display apparatus of claim 13, wherein the first diameter of the pore is approximately ¼ of the fourth height of the flexible substrate.

17. The display apparatus of claim 8, wherein the buffer layer includes a plurality of inorganic films that are alternately disposed.

18. A display apparatus, comprising:
- a flexible substrate including a plurality of pores with an opening in a bottom surface of the flexible substrate, wherein an area of the opening of the plurality of pores is less than a diameter of the plurality of pores; and
- a pixel array layer disposed on a top surface of the flexible substrate, the top surface opposite to the bottom surface.

19. The display apparatus of claim 18, wherein the flexible substrate includes a top portion and a bottom portion on opposite sides of a center plane through the flexible substrate, the top portion extending from the center plane to the top surface and the bottom portion extending from the center plane to the bottom surface, the plurality of pores being in the bottom portion of the flexible substrate.

20. The display apparatus of claim 19, wherein the bottom portion includes a pore top edge plane that is tangent to a top most edge of each of the plurality of pores, the pore top edge plane being centered in the bottom portion with respect to the center plane and the bottom surface.

\* \* \* \* \*